(12) United States Patent
Hwang

(10) Patent No.: US 11,715,821 B2
(45) Date of Patent: Aug. 1, 2023

(54) ELECTRONIC ELEMENT MODULE AND PRINTED CIRCUIT BOARD FOR THE SAME

(71) Applicant: SAMSUNG ELECTRO-MECHANICS CO., LTD., Suwon-si (KR)

(72) Inventor: Jun Oh Hwang, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 361 days.

(21) Appl. No.: 17/215,756

(22) Filed: Mar. 29, 2021

(65) Prior Publication Data

US 2022/0093835 A1 Mar. 24, 2022

(30) Foreign Application Priority Data

Sep. 21, 2020 (KR) .................. 10-2020-0121704

(51) Int. Cl.
| | |
|---|---|
| *H01L 33/62* | (2010.01) |
| *G02F 1/13357* | (2006.01) |
| *H05K 1/18* | (2006.01) |
| *H05K 1/11* | (2006.01) |

(52) U.S. Cl.
CPC ........ *H01L 33/62* (2013.01); *G02F 1/133603* (2013.01); *H05K 1/115* (2013.01); *H05K 1/183* (2013.01); *H05K 2201/10106* (2013.01)

(58) Field of Classification Search
CPC ... H01L 33/62; G02F 1/133603; H05K 1/115; H05K 1/183; H05K 2201/10106
See application file for complete search history.

(56) References Cited

U.S. PATENT DOCUMENTS 10,672,946 B2 * 6/2020 Cho ..................... H01L 33/405

FOREIGN PATENT DOCUMENTS

| JP | 2017-195352 A | 10/2017 |
|---|---|---|
| KR | 10-1423458 B1 | 7/2014 |

* cited by examiner

*Primary Examiner* — Mary Ellen Bowman
(74) *Attorney, Agent, or Firm* — Morgan, Lewis & Bockius LLP

(57) ABSTRACT

The present disclosure relates to an electronic element module including a printed circuit board including a first insulating layer having a plurality of first openings, and a build-up structure disposed on one surface of the first insulating layer and having a first through-portion, wherein the plurality of first openings are disposed in the first through-portion on a plane; a conductive adhesive disposed in at least a portion of each of the plurality of first openings; and a first electronic element disposed in the first through-portion, and having a plurality of first electrode pads disposed. At least a portion of each of the plurality of first electrode pads is disposed in the plurality of first openings.

23 Claims, 10 Drawing Sheets

ELECTRONIC ELEMENT MODULE AND PRINTED CIRCUIT BOARD FOR THE SAME

CROSS-REFERENCE TO RELATED APPLICATION(S)

This application claims benefit of priority to Korean Patent Application No. 10-2020-0121704 filed on Sep. 21, 2020 in the Korean Intellectual Property Office, the disclosure of which is incorporated herein by reference in its entirety.

BACKGROUND

The present disclosure relates to an electronic element module, for example, to a light emitting diode (LED) module, and a printed circuit board for the same, for example, a back light unit (BLU) substrate.

In general, in the case of an LED module for a display, a plurality of LED elements are disposed on a surface of a BLU substrate in surface mount form, respectively. In this case, both a thickness of the BLU substrate and a thickness of the LED element affect the thickness of the display, and thus the overall thickness of the display may increase. There is a need for a substrate solution, or the like, for a reduction thereof.

SUMMARY

An aspect of the present disclosure is to provide an electronic element module capable of being thinned and a printed circuit board used therein.

Another aspect of the present disclosure is to provide an electronic element module capable of improving signal transmission characteristics and a printed circuit board used therefor.

One of the various solutions proposed through the present disclosure is to directly place an electronic element on a substrate so that a plurality of pads of the electronic element are disposed in a plurality of openings of the substrate, respectively, in the through-portion of the build-up structure disposed on the substrate.

For example, according to an aspect of the present disclosure, an electronic element module includes: a first insulating layer having a plurality of first openings, and a build-up structure disposed on one surface of the first insulating layer and having a first through-portion, wherein the plurality of first openings are disposed in the first through-portion on a plane; a conductive adhesive disposed in at least a portion of each of the plurality of first openings; and a first electronic element disposed in the first through-portion, and having a plurality of first electrode pads. At least a portion of each of the plurality of first electrode pads is disposed in the plurality of first openings.

For example, according to an aspect of the present disclosure, a printed circuit board includes: a first insulating layer having a plurality of openings; a first wiring layer disposed on a lower surface of the first insulating layer, and having a plurality of pad patterns respectively covering bottoms of the plurality of openings; and a build-up structure disposed on an upper surface of the first insulating layer, and including a second insulating layer and a second wiring layer, and having a through-portion penetrating through the second insulating layer, wherein the plurality of openings may be disposed in the through-portion on a plane.

For example, according to an aspect of the present disclosure, an electronic element module includes: a printed circuit board including a first insulating layer having a plurality of openings, and a build-up structure disposed on an upper surface of the first insulating layer and having a through-portion; an electronic element disposed in the through-portion, and having a plurality of electrode pads protruding from a surface of the electronic component and respectively disposed in the plurality of openings; and a conductive adhesive disposed in at least a portion of each of the plurality of openings. The surface of the first electronic component is disposed on the upper surface of the first insulating layer.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
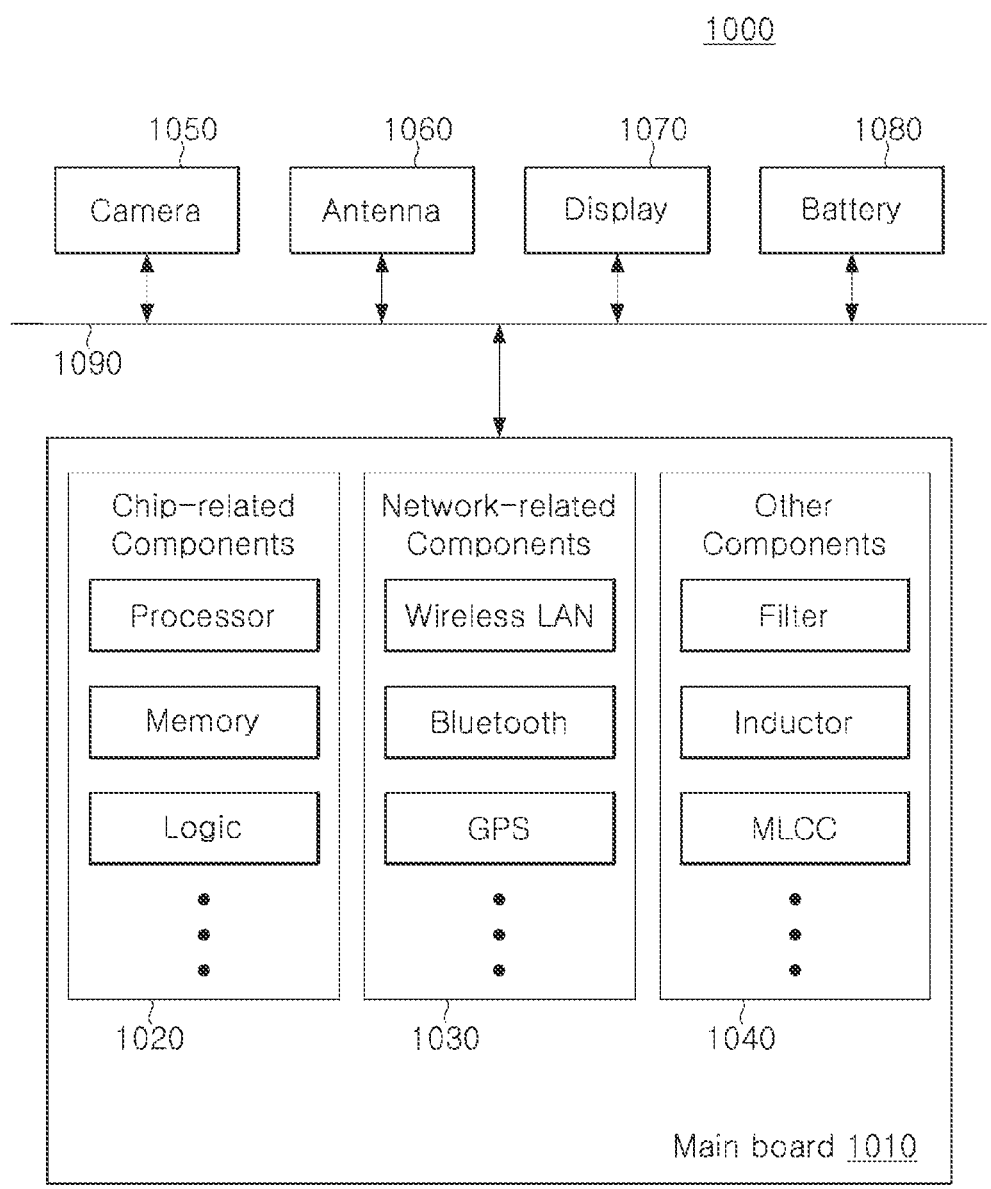
FIG. 1 is a block diagram schematically illustrating an example of an electronic device system.

Hereinafter, example embodiments of the present disclosure will be described with reference to the accompanying drawings. In the drawings, shapes, sizes, and the like, of elements may be exaggerated or briefly illustrated for clarity of description.

FIG. 1 is a block diagram schematically illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, and may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, and may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
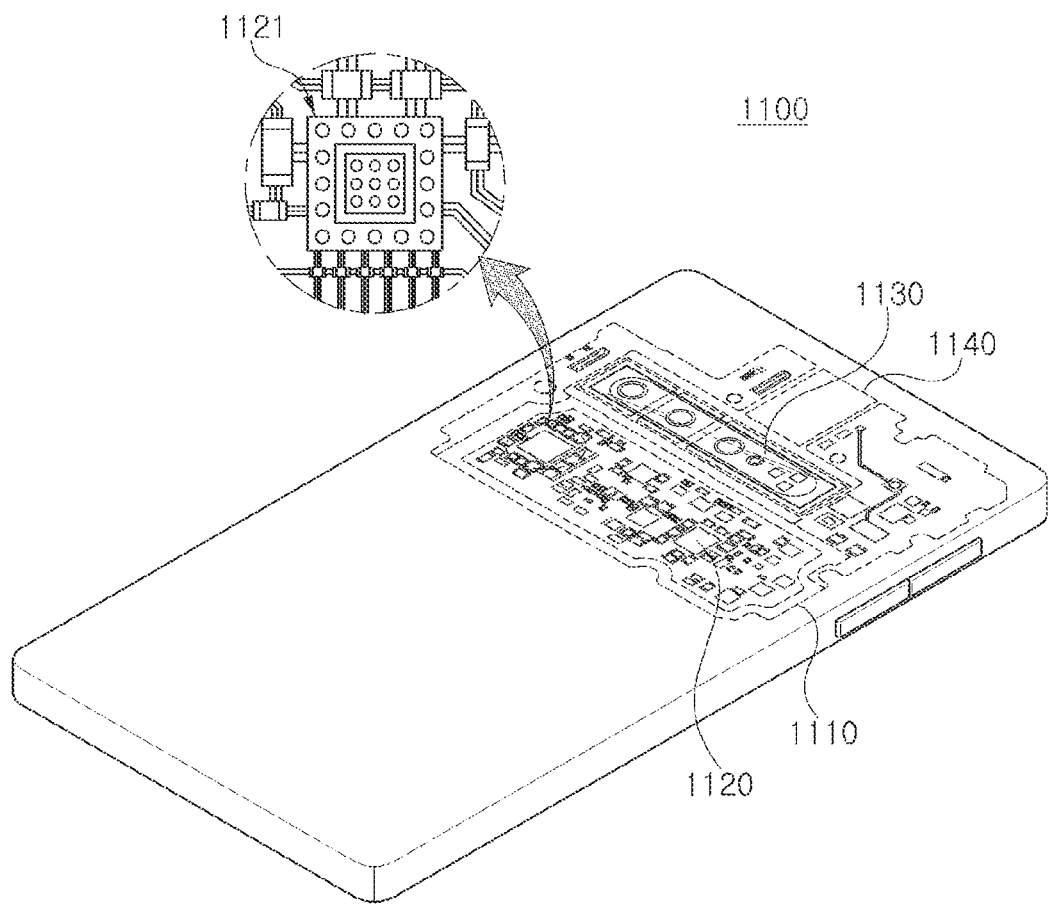
FIG. 2 is a perspective view schematically illustrating an example of an electronic device.

FIG. 2 is a perspective diagram schematically illustrating an example of an electronic device.

Referring to FIG. 2, the electronic device may be a smartphone 1100. For example, a motherboard 1110 may be accommodated in the smartphone 1100, and various electronic components 1120 may be physically or electrically connected to the motherboard 1110. In addition, other components that may or may not be physically or electrically connected to the motherboard 1110, such as a camera module 1130 and/or a speaker 1140, may be accommodated in the smartphone 1110. Some of the electronic components 1120 may be the chip related components, a semiconductor package 1121, for example, but are not limited thereto. The electronic device is not necessarily limited to the smartphone 1100, but may be other electronic devices as described above.

Figure 3:
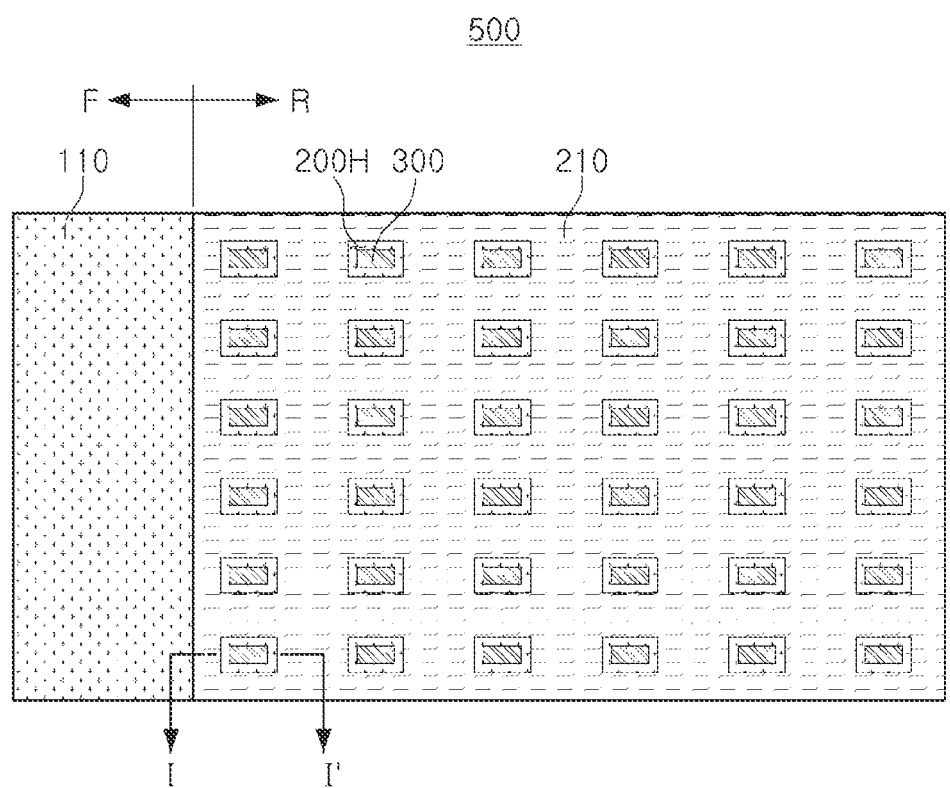
FIG. 3 is a plan view schematically illustrating an example of an electronic element module.

FIG. 3 is a plan view schematically illustrating an example of an electronic element module.

Figure 4:
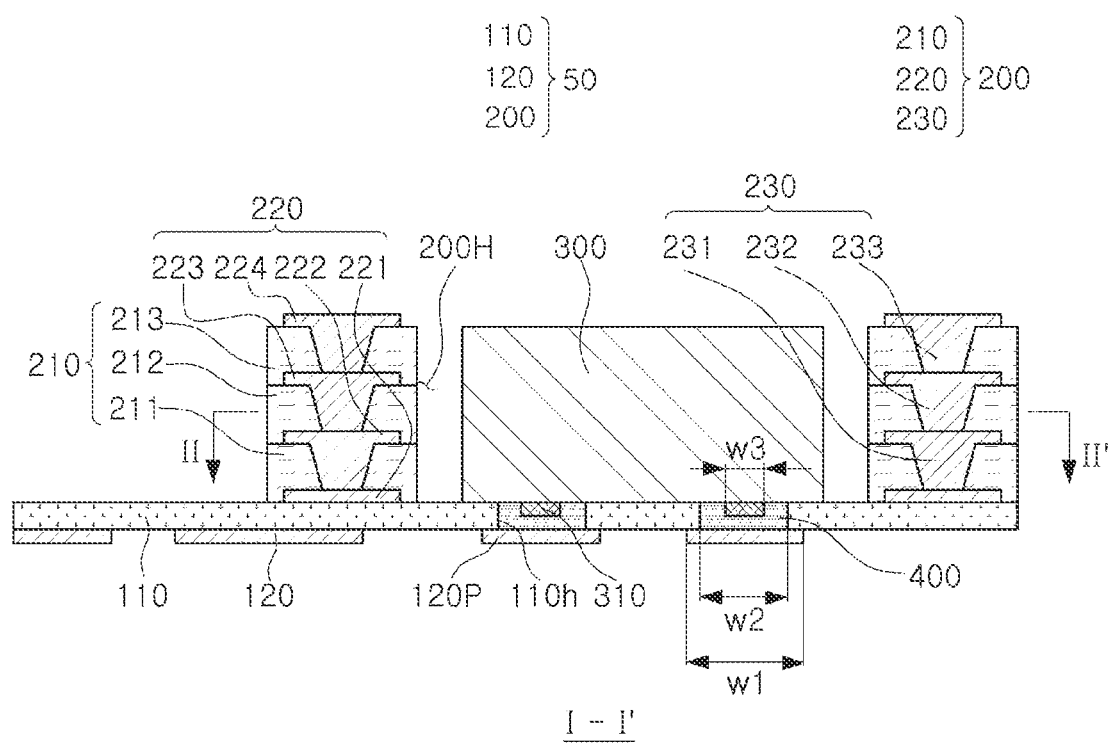
FIG. 4 is a schematic cross-sectional view taken along line I-I' of the electronic element module of FIG. 3.

FIG. 4 is a schematic cross-sectional view taken along line I-I' of the electronic element module of FIG. 3.

Figure 5:
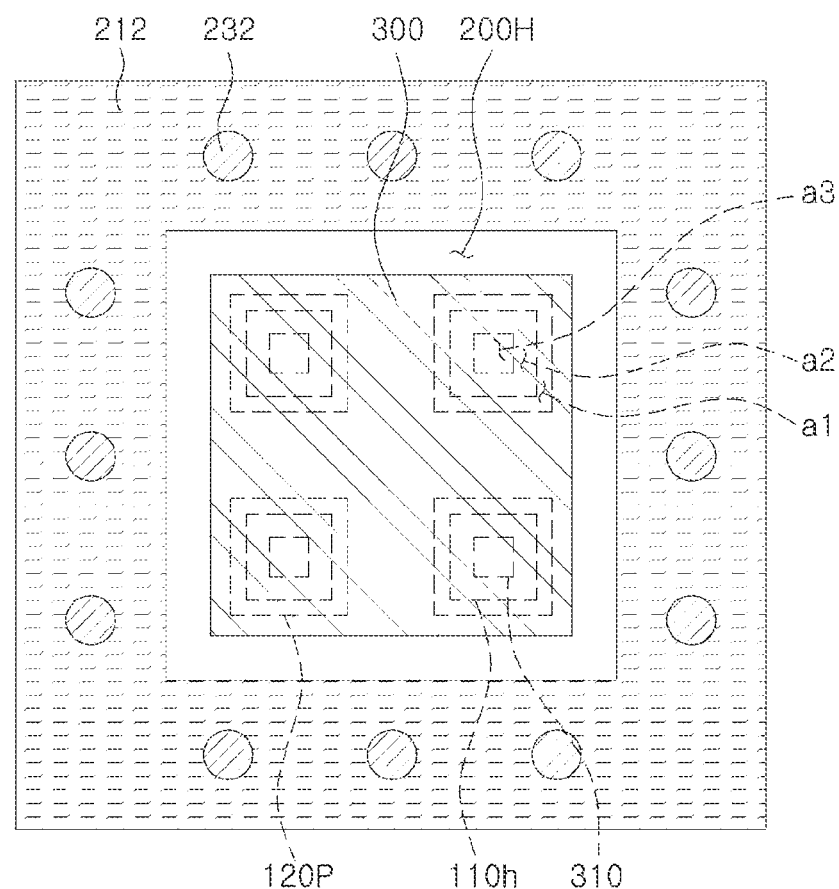
FIG. 5 is a schematic plan view taken along line II-II' of the electronic element module of FIG. 4.

FIG. 5 is a schematic plan view taken along line II-II' of the electronic element module of FIG. 4

Referring to the drawings, an electronic element module 500 according to an example includes a printed circuit board 50 including a first insulating layer 110, a first wiring layer 120 disposed on a lower surface of the first insulating layer 110, and a build-up structure 200 disposed on an upper surface of the first insulating layer 110 and including a second insulating layer 210, a second wiring layer 220, and a second wiring via layer 230, an electronic element 300 disposed in a through-portion 200H of the build-up structure 200 and having a plurality of electrode pads 310 in which at least a portion of each thereof is disposed in the plurality of openings 110h of the first insulating layer 110, and a conductive adhesive 400 filling at least a portion of each of the plurality of openings 110H of the first insulating layer 110.

As described above, in the electronic element module 500 according to an example, since the electronic element 300 is disposed in the through-portion 200H of the build-up structure 200, the module may be thinned. In particular, the electronic element 300 is directly disposed on the first insulating layer 110, and since the plurality of electrode pads 310 of the electronic element 300 are disposed within the plurality of openings 110h of the first insulating layer 110, respectively, the electronic element module 500 can be further thinned. In addition, since the plurality of electrode pads 310 of the electronic element 300 are electrically connected to a plurality of first pad patterns 120P of the first wiring layer 120 disposed on the lower surface of the first insulating layer 110, respectively, a signal path may be shortened, and thus it may be more advantageous for the signal transmission characteristics.

Meanwhile, the plurality of openings 110h may penetrate through the first insulating layer 110, respectively, and the plurality of pad patterns 120P of the first wiring layer 120 may block bottoms of each of the plurality of openings 110h.

In this case, when a width of each of the plurality of pad patterns 120P is w1, a width of each of the plurality of openings 110h is w2, and a width of each of the plurality of electrode pads 310 is w3, on a cross-section, w1>w2>w3 can be satisfied. In one example, the cross-section may refer to a cross-section cut along a stacking direction of layers in the build-up structure 200.

In addition, when an area of each of the plurality of pad patterns 120P is a1, an area of each of the plurality of openings 110h is a2, and an area of each of the plurality of electrode pads 120P is a3 on a plane, a1>a2>a3 can be satisfied. In one example, the plane may refer to a plane parallel to an upper surface of the build-up structure.

By satisfying these conditions, the plurality of electrode pads 310 may be more stably disposed in the plurality of openings 110h, and a conductive adhesive 400 may be more stably disposed with the plurality of openings 110h, respectively, through the plurality of pad patterns 120P.

Meanwhile, the build-up structure 200 may include a plurality of through-portions 200H described above. In each of the plurality of through-portions 200H on a plane, the plurality of openings 110H described above may be disposed in the same or a different shape (shape, number, or the like).

As described above, an electronic element 300 may be disposed in each of the plurality of through-portions 200H such that at least a portion of each of the plurality of electrode pads 310 is disposed in the plurality of openings 110H as described above.

The electronic element 300 may be an element of the same type, for example, an LED element, and in this case, each of the LED elements may have the same or different functions and shapes.

The above-described printed circuit board 50 on which such an LED element is disposed may be a BLU substrate.

For example, in the printed circuit board 50, the first insulating layer 110 may further have a plurality of second openings, the build-up structure 200 may further have a second through-portion, and the plurality of second openings may be disposed in the second through-portion on a plane. The conductive adhesive 400 may also fill at least a portion of each of the plurality of second openings. A second electronic element having a plurality of second electrode pads in which at least a portion of each thereof is disposed in the plurality of second openings may be disposed in second through-portion. The plurality of second openings may penetrate through the first insulating layer, respectively, and the first wiring layer 120 may further have a plurality of second pad patterns blocking bottoms of each of the plurality of second openings.

Meanwhile, the first insulating layer 110 may include a flexible insulating material. Here, the flexible insulating material refers to a material having sufficient flexibility and may have a relatively lower modulus than, for example, a rigid insulating material to be described later. For example, the first insulating layer 110 may include a flexible copper clad laminate (FCCL) insulating material. More specifically, the first insulating layer 110 may include polyimide, polyetherene terephthalate, polyethylene naphthalate, an amorphous polyimide, a liquid crystal polymer, and/or an adhesive including, as a main material, an epoxy resin formulated for lowering the elastic modulus.

In addition, the second insulating layer 210 may include a rigid insulating material. Here, the rigid insulating material refers to a material having sufficient rigidity, and may have a relatively higher modulus than the above-described flexible insulating material. For example, the second insulating layer 210 may include an insulating material of a Copper Clad Laminate (CCL).

More specifically, each of the insulating layers 211, 212, and 213 of the second insulating layer 210 may include a prepreg (PPG) and/or an Ajinomoto Build-up Film (ABF).

In this regard, the printed circuit board 50 may include a rigid region R and a flexible region F. For example, the printed circuit board 50 may be a rigid-flexible printed circuit board. The build-up structure 200 and the electronic element 300 may be disposed in the rigid region R. For example, in the electronic element module 500 according to an example, a region in which the build-up structure 200 having a plurality of through-portions 200H is disposed may be a rigid region R, and an electronic element 300 may be disposed in each of the plurality of through-portions 200H of the build-up structure 200 on the rigid region R.

Hereinafter, each configuration of the electronic element module 500 according to an example will be described in more detail with reference to the drawings.

As described above, the first insulating layer 110 may include a flexible insulating material. Here, the flexible insulating material refers to a material having sufficient flexibility, and may have a relatively lower modulus than, for example, a rigid insulating material described later.

For example, the first insulating layer 110 may include an insulating material of FCCL.

More specifically, the first insulating layer 110 may include polyimide, polyetheleneterephthalate, polyethylene naphthalate, an amorphous polyimide, a liquid crystal polymer, and/or an adhesive including, as a main material, an epoxy resin formulated for lowering the elastic modulus. If necessary, the first insulating layer 110 may be formed of multiple layers.

The first wiring layer 120 may include a metal material. In this case, as the metal material, copper (Cu), aluminum (Al), silver (Ag), tin (Sn), gold (Au), nickel (Ni), lead (Pb), titanium (Ti), or alloys thereof may be used. The first wiring layer 120 may perform various functions according to design. For example, the first wiring layer 120 may include a ground (GND) pattern, a power (PWR) pattern, a signal (S) pattern, and the like. Each of the patterns may have a line shape, a plane shape, or a pad shape. These patterns may be formed through a plating process such as an additive process (AP), a semi AP (SAP), a modified SAP (MSAP), tenting (TT), or the like, and accordingly, the first wiring layer 120 may include a seed layer, an electroless plating layer, and an electrolytic plating layer formed based on the seed layer. If necessary, a metal foil and/or a primer resin of the metal foil may be further included.

If necessary, a first wiring via layer connected to the first wiring layer 120 may be formed in the first insulating layer 110. The first wiring via layer may penetrate through the first insulating layer 110, and may electrically connect an additional wiring layer disposed on an upper surface of the first insulating layer 110 and the first wiring layer 120. The first wiring layer 120 may include a metal material such as copper (Cu), aluminum (Al), silver (Ag), tin (Sn), gold (Au), nickel (Ni), lead (Pb), titanium (Ti), or alloys thereof. The first wiring layer 120 may include a connection via used for a signal, a connection via used for a ground, a connection via used for power, and the like, according to a design. A wiring via of the wiring via layer may be completely filled with a metal material, respectively, or may be a via in which a metal material may be formed along a wall surface of the via hole. In addition, it may have a tapered shape, an hourglass or a cylindrical shape. The first wiring via layer may be formed by a plating process, for example, a process such as an AP, a SAP, a MSAP, a TT, or the like, and accordingly, the first wiring via layer 120 may include a seed layer, an electroless plating layer, and an electrolytic plating layer formed based on the seed layer.

The build-up structure 200 includes a second insulating layer 210, a second wiring layer 220 and a second wiring via layer 230. Each of the second insulating layer 210, the second wiring layer 220, and the second wiring via layer 230 may be formed of a plurality of layers. For example, the second insulating layer 210 may include 2-1 to 2-3 insulating layers 211, 212, and 213. In addition, the second wiring layer 220 may include 2-1 to 2-4 wiring layers 221, 222, 223, and 224. In addition, the second wiring via layer 230 may include 2-1 to 2-3 wiring via layers 231, 232, and 233. The number of each of the layers may be more or less than that shown in the drawings.

For example, the build-up structure 200 may include a 2-1 insulating layer 211, a 2-1 wiring layer 221 embedded below the 2-1 insulating layer 211, a 2-2 wiring layer 222 disposed on an upper surface of the 2-1 insulating layer 211, a 2-1 wiring via layer 231 penetrating through the 2-1 insulting layer 211 and connecting the 2-1 and 2-2 wiring layers 221 and 222, a 2-2 insulating layer 212 disposed on the 2-1 insulating layer 211 and covering the 2-2 wiring layer 222, a 2-3 wiring layer 223 disposed on an upper surface of the 2-2 insulating layer 212, a 2-2 wiring via layer 232 penetrating through the 2-2 insulating layer 212 and connecting the 2-2 and 2-3 wiring layers 222 and 223, a 2-3 insulating layer 213 disposed on the 2-2 insulating layer 212 and covering the 2-3 wiring layer 223, a 2-4 wiring layer 224 disposed on an upper surface of the 2-3 insulating layer 213, and a 2-3 wiring via layer 233 penetrating through the 2-3 insulating layer 213 and connecting the 2-3 and 2-4 wiring layers 223 and 224.

As described above, the second insulating layer 210 may include a rigid insulating material. Here, the rigid insulating material refers to a material having sufficient rigidity, and may have a relatively higher modulus than, for example, the above-described flexible insulating material. For example, the second insulating layer 210 may be a thermosetting resin such as an epoxy resin or a thermoplastic resin such as polyimide, and those containing an inorganic filler such as silica and/or a reinforcing material such as glass fiber. For example, each of the insulating layer 211, 212, and 213 of the second insulating layer 210 may include PPG, and/or ABF.

The second wiring layer 220 may include a metal material. In this case, as the metal material, copper (Cu), aluminum (Al), silver (Ag), tin (Sn), gold (Au), nickel (Ni), lead (Pb), titanium (Ti), or alloys thereof may be used. Each of the wiring layers 221, 222, 223, and 224 of the second wiring layer 220 may perform various functions according to a design. For example, the second wiring layer 220 may include a ground (GND) pattern, a power (PWR) pattern, a signal (S) pattern, and the like. Here, the signal pattern includes various signals, for example, data signals, excluding a ground pattern, a power pattern, and the like. Each of these patterns may include a line pattern, a plane pattern, and/or a pad pattern. These patterns may be formed through a process such as an AP, a SAP, a MSAP, a TT, or the like, and accordingly, the second wiring layer 132 may include a seed layer, an electroless plating layer, and an electrolytic plating layer formed based on the seed layer. If necessary, a metal foil and/or a primer resin of copper foil may also be further included.

The second wiring via layer 230 may include a metal material. In this case, as the metal material, copper (Cu), aluminum (Al), silver (Ag), tin (Sn), gold (Au), nickel (Ni), lead (Pb), titanium (Ti), or alloys thereof may be used. Each of the wiring via layers 231, 232, and 233 of the second wiring via layer 230 may include a signal connection via, a ground connection via, a power connection via, or the like, according to a design. A wiring via of each of the wiring via layers 231, 232, and 233 of the second wiring via layer 230 may be completely filled with a metal material, respectively, or may be a via in which a metal material may be formed along a wall surface of the via hole. In addition, it may have a tapered shape, an hourglass or a cylindrical shape. These may be formed by a plating process, for example, a process such as an AP, a SAP, a MSAP, a TT, or the like, and accordingly, the second wiring via layer 230 may include a seed layer, an electroless plating layer, and an electrolytic plating layer formed based on the seed layer.

The electronic element 300 may be an integrated circuit (IC) in which hundreds to millions of elements are integrated into one chip. For example, the electronic element 300 may be an LED element, more specifically, a mini LED element having a small size. The electronic element 300 may have a plurality of electrode pads 310 on one surface. Each of the plurality of electrode pads 310 may include a metal material such as copper (Cu) and aluminum (Al). The plurality of electrode pads 310 may protrude from one surface of the electronic element 300.

The conductive adhesive 400 may be an adhesive in which a conductive material such conductive powder is dispersed in a binder resin, or the like. For example, the conductive adhesive 400 may include an anisotropic conductive film (ACF), but is not limited thereto.

FIGS. 6 to 12 are process diagrams schematically illustrating an example of manufacturing the electronic element module of FIG. 3.

Figure 6:
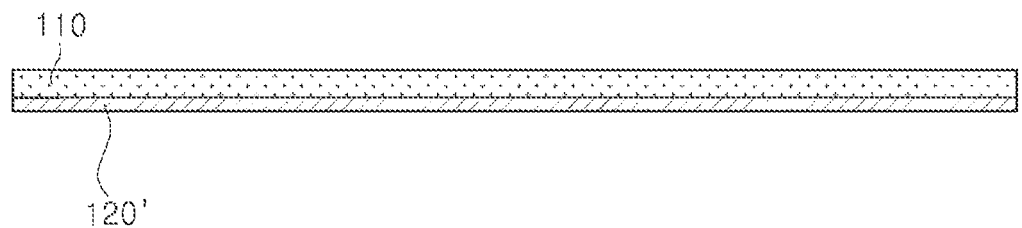
FIGS. 6 to 12 are process diagrams schematically illustrating an example of manufacturing the electronic element module of FIG. 3.

Referring to FIG. 6, first, a substrate including a first insulating layer 110 and a metal foil 120' such as copper foil disposed on a lower surface thereof is prepared. Such a substrate may be a FCCL or the like.

Figure 7:
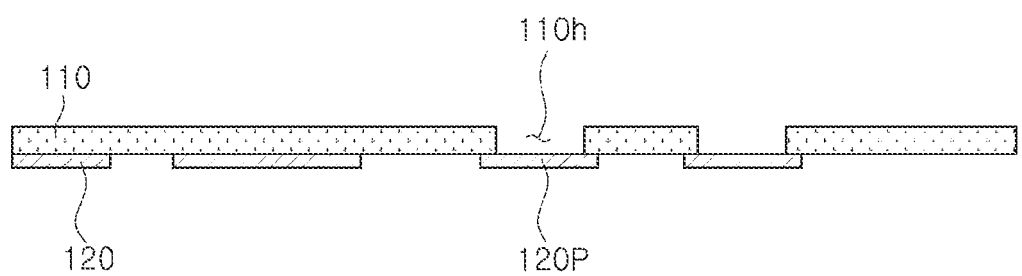

Referring to FIG. 7, a first wiring layer 120 having a plurality of first pad patterns 120P is formed on the lower surface of the first insulating layer 110 by a plating process using a metal foil 120'. In addition, a plurality of openings 110h are formed in the first insulating layer 110 by a laser drill and/or a mechanical drill.

Figure 8:
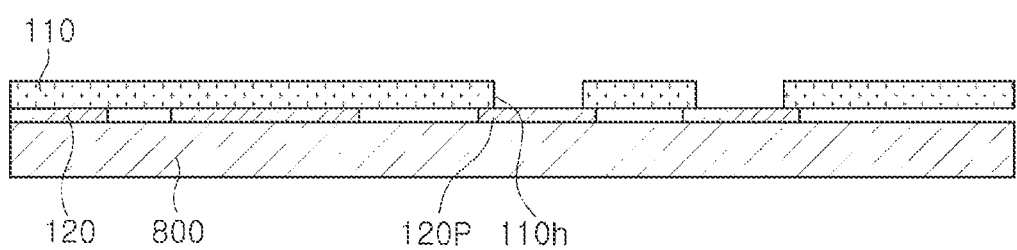

Referring to FIG. 8, next, a detachable core 800 is attached below the first wiring layer 120 for process warpage control.

Figure 9:
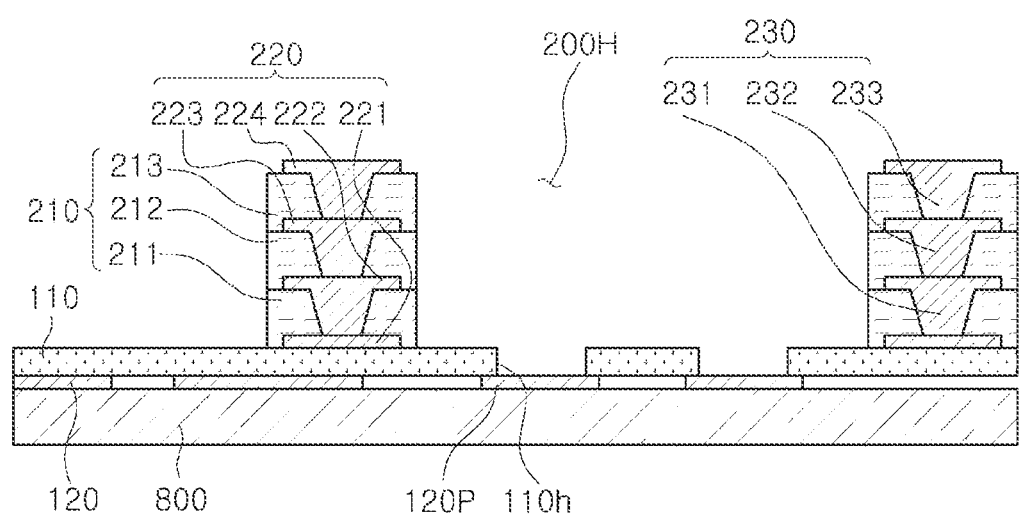

Referring to FIG. 9, next, a second insulating layer 210, a second wiring layer 220, and a second wiring via layer 230 are formed on an upper surface of the first insulating layer 110 through a sequential stacking and plating process, and in addition, a through-portion 200H is formed by a laser drill and/or mechanical drill.

Figure 10:
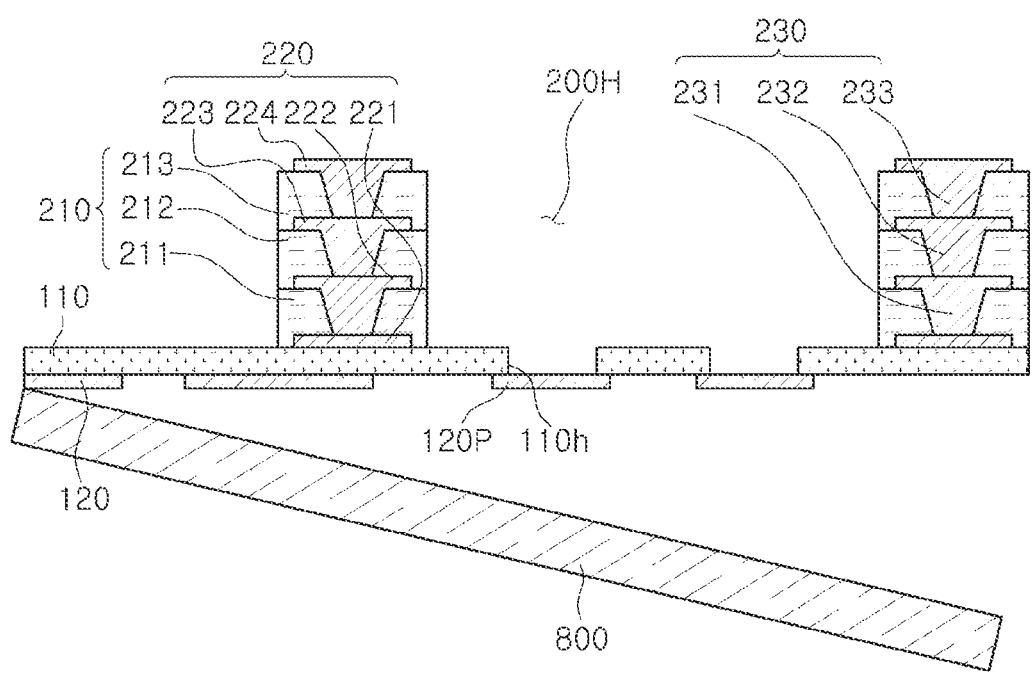

Referring to FIG. 10, next, the detachable core 800 is separated.

Figure 11:
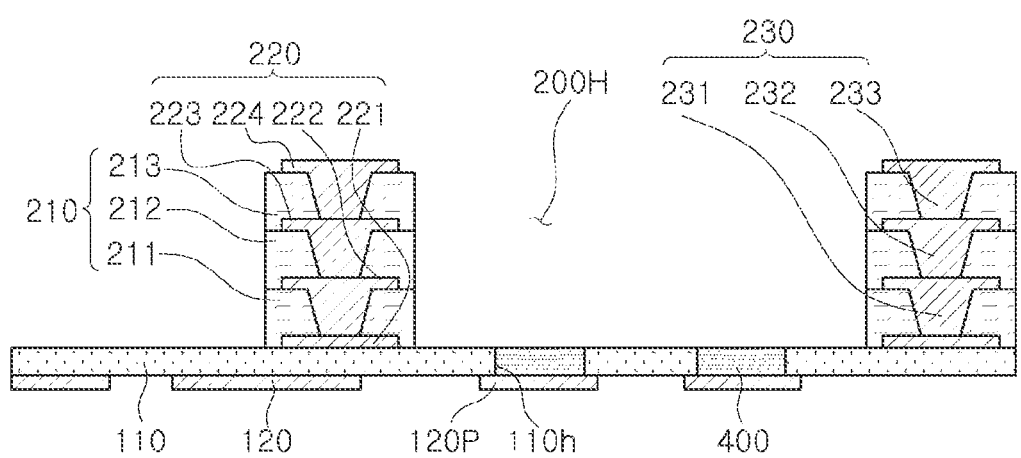

Referring to FIG. 11, a plurality of openings 110h of the first insulating layer 110 are filled with a conductive adhesive 400.

Figure 12:
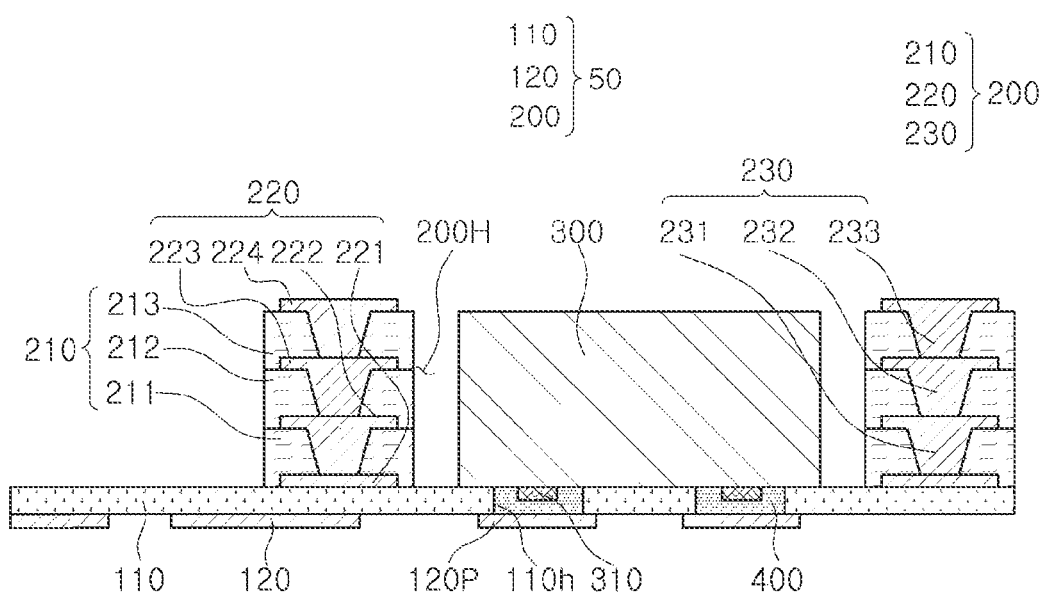

Referring to FIG. 12, an electronic element 300 is directly mounted on the surface of the first insulating layer 110 exposed through the through-portion 200H of the build-up structure 200. In this case, at least a portion each of the plurality of electrode pads 310 of the electronic element 300 may be disposed in the plurality of openings 110h of the first insulating layer 110, and may be electrically connected to the plurality of pad patterns 120P of the first wiring layer 120 through the conductive adhesive 400, respectively.

Other details are substantially the same as described above, and detailed descriptions are omitted.

As set forth above, as one of various effects of the present disclosure, an electronic element module capable of thinning and a printed circuit board for the same may be provided.

As another of various effects of the present disclosure, an electronic element module capable of improving signal transmission characteristics and a printed circuit board for the same may be provided.

In the example embodiments, the terms "side region," "side surface," and the like, may be used to refer to a surface formed taken in right/left directions, the terms "lower side," "lower portion," "lower surface," and the like, may be used to refer to directions facing downwardly with reference to a cross-section in the diagrams for ease of description, and the terms "upper side," "upper portion," "upper surfaces," and the like, may be used to refer to directions opposing the above directions. The notion that an element is disposed on a side region, an upper side, an upper region, or a lower resin may include the configuration in which the element is directly in contact with an element configured as a reference in respective directions, and the configuration in which the element is not directly in contact with the reference element. The terms may be defined as above for ease of description, and the scope of right of the example embodiments is not particularly limited to the above terms.

In the example embodiments, the term "connected" may not only refer to "directly connected" but also include "indirectly connected" by means of an adhesive layer, or the like. Also, the term "electrically connected" may include both of the case in which elements are "physically connected" and the case in which elements are "not physically connected." Further, the terms "first," "second," and the like may be used to distinguish one element from the other, and may not limit a sequence and/or an importance, or others, in relation to the elements. In some cases, a first element may be referred to as a second element, and similarly, a second element may be referred to as a first element without departing from the scope of right of the example embodiments.

In the example embodiments, the term "example embodiment" may not refer to one same example embodiment, but may be provided to describe and emphasize different unique features of each example embodiment. The above suggested example embodiments may be implemented do not exclude the possibilities of combination with features of other example embodiments. For example, even though the features described in one example embodiment are not described in the other example embodiment, the description may be understood as relevant to the other example embodiment unless otherwise indicated.

The terms used in the example embodiments are used to simply describe an example embodiment, and are not intended to limit the present disclosure. A singular term includes a plural form unless otherwise indicated.

While the example embodiments have been shown and described above, it will be apparent to those skilled in the art that modifications and variations could be made without departing from the scope of the present invention as defined by the appended claims.

What is claimed is:

1. An electronic element module, comprising:
a printed circuit board including a first insulating layer having a plurality of first openings, and a build-up structure disposed on one surface of the first insulating layer and having a first through-portion, wherein the plurality of first openings are disposed in the first through-portion on a plane;
a conductive adhesive disposed in at least a portion of each of the plurality of first openings; and
a first electronic element disposed in the first through-portion, and having a plurality of first electrode pads, at least a portion of each of the plurality of first electrode pads being disposed in the plurality of first openings.

2. The electronic element module of claim 1, wherein the plurality of first openings penetrate through the first insulating layer, respectively.

3. The electronic element module of claim 2, wherein the printed circuit board further comprises a first wiring layer disposed on the other surface of the first insulating layer and having a plurality of pad patterns respectively covering bottoms of the plurality of first openings.

4. The electronic element module of claim 3, wherein w1>w2>w3 is satisfied, in which w1 is a width of each of the plurality of first pad patterns, w2 is a width of each of the plurality of first openings, and w3 is a width of each of the plurality of first electrode pads, on a cross-section.

5. The electronic element module of claim 3, wherein a1>a2>a3 is satisfied, in which a1 is an area of each of the plurality of first pad patterns, a2 is an area of each of the plurality of first openings, and a2 is an area of each of the plurality of first electrode pads, on the plane.

6. The electronic element module of claim 1, wherein the first insulating layer comprises a flexible insulating material.

7. The electronic element module of claim 6, wherein the build-up structure comprises a second insulating layer, a second wiring layer, and a second wiring via layer, and
the first through-portion penetrates through the second insulating layer.

8. The electronic element module of claim 7, wherein the second insulating layer comprises a rigid insulating material.

9. The electronic element module of claim 1, wherein the printed circuit board has a rigid region and a flexible region, and
the build-up structure and the first electronic element are disposed in the rigid region.

10. The electronic element module of claim 1, wherein the printed circuit board comprises a back light unit (BLU) substrate, and
the first electronic element comprises a light emitting diode (LED) element.

11. The electronic element module of claim 1, wherein the conductive adhesive comprises an anisotropic conductive film (ACF).

12. The electronic element module of claim 1, wherein in the printed circuit board, the first insulating layer further has a plurality of second openings, the build-up structure further has a second through-portion, and the plurality of second openings are disposed in the second through-portion on the plane,
the conductive adhesive is also disposed in at least a portion of each of the plurality of second openings, and
a second electronic element disposed in the second through-portion and having a plurality of second electrode pads, at least a portion of each of the plurality of second electrode pads being disposed in the plurality of second openings.

13. The electronic element module of claim 12, wherein the plurality of first openings and the plurality of second openings penetrate through the first insulating layer, respectively, and the first wiring layer has a plurality of first pad patterns respectively covering bottoms of the plurality of first openings and a plurality of second pad patterns respectively covering bottoms the plurality of second openings.

14. A printed circuit board, comprising:
a first insulating layer having a plurality of openings;
a first wiring layer disposed on a lower surface of the first insulating layer, and having a plurality of pad patterns respectively covering bottoms of the plurality of openings; and
a build-up structure disposed on an upper surface of the first insulating layer, including a second insulating layer and a second wiring layer, and having a through-portion penetrating through the second insulating layer,
wherein the plurality of openings are disposed in the through-portion on a plane.

15. The printed circuit board of claim 14, wherein the first insulating layer comprises a flexible material, and
the second insulating layer comprises a rigid material.

16. The printed circuit board of claim 14, wherein the build-up structure comprises the plurality of through-portions, and
the plurality of openings are disposed in each of the plurality of through-portions, on the plane.

17. An electronic element module, comprising:
a printed circuit board including a first insulating layer having a plurality of openings, and a build-up structure disposed on an upper surface of the first insulating layer and having a through-portion;

an electronic element disposed in the through-portion, and having a plurality of electrode pads protruding from a surface of the electronic component and respectively disposed in the plurality of openings; and a conductive adhesive disposed in at least a portion of each of the plurality of openings, wherein the surface of the first electronic component is disposed on the upper surface of the first insulating layer.

18. The electronic element module of claim 17, wherein the printed circuit board further comprises a first wiring layer disposed on a lower surface of the first insulating layer and having a plurality of pad patterns respectively covering the plurality of openings.

19. The electronic element module of claim 18, wherein the plurality of electrode pads are respectively connected to the plurality of pad patterns through the conductive adhesive respectively disposed in the openings.

20. The electronic element module of claim 17, wherein a region of the first insulating layer outside the through-portion is spaced apart from the build-up structure.

21. The electronic element module of claim 17, wherein the electronic element comprises a light emitting diode (LED) element.

22. The electronic element module of claim 17, wherein the conductive adhesive comprises an anisotropic conductive film (ACF).

23. The electronic element module of claim 17, wherein the build-up structure comprises a second insulating layer, a wiring layer, and a wiring via layer connected to the wiring layer, and the through-portion penetrates through the second insulating layer.

\* \* \* \* \*